US012563836B2

(12) United States Patent
Wang et al.

(10) Patent No.: US 12,563,836 B2
(45) Date of Patent: Feb. 24, 2026

(54) DISPLAY SUBSTRATE AND DISPLAY DEVICE

(71) Applicant: BOE TECHNOLOGY GROUP CO., LTD., Beijing (CN)

(72) Inventors: Lizhong Wang, Beijing (CN); Ce Ning, Beijing (CN); Wei Yang, Beijing (CN); Tianmin Zhou, Beijing (CN); Liping Lei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 418 days.

(21) Appl. No.: 18/021,863

(22) PCT Filed: Mar. 23, 2022

(86) PCT No.: PCT/CN2022/082407
§ 371 (c)(1),
(2) Date: Feb. 17, 2023

(87) PCT Pub. No.: WO2023/178540
PCT Pub. Date: Sep. 28, 2023

(65) Prior Publication Data
US 2024/0266355 A1 Aug. 8, 2024

(51) Int. Cl.
*H01L 27/12* (2006.01)
*H10D 86/40* (2025.01)
*H10D 86/60* (2025.01)

(52) U.S. Cl.
CPC ........... *H10D 86/60* (2025.01); *H10D 86/423* (2025.01); *H10D 86/443* (2025.01); *H10D 86/471* (2025.01)

(58) Field of Classification Search
CPC ...... H10D 86/00; H10D 86/60; H10D 86/443; H10D 86/471; H10D 86/423;
(Continued)

(56) References Cited

U.S. PATENT DOCUMENTS 10,141,387 B2 * 11/2018 Lius ..................... H10K 59/123
11,276,739 B2 * 3/2022 Niu ...................... G09G 3/3225
(Continued)

FOREIGN PATENT DOCUMENTS

CN       107331671 A       11/2017
CN       107785405 A       3/2018
(Continued)

*Primary Examiner* — Nikolay K Yushin
(74) *Attorney, Agent, or Firm* — HOUTTEMAN LAW LLC

(57) ABSTRACT

A display substrate and a display device are provided. The display substrate includes: a base substrate, and a low temperature poly-silicon thin film transistor and a metal oxide thin film transistor on the base substrate; the low temperature poly-silicon thin film transistor includes: a low temperature poly-silicon semiconductor layer, a first gate insulating layer, a first gate electrode, a first interlayer insulating layer, a first source electrode, and a first drain electrode; the metal oxide thin film transistor includes: a metal oxide semiconductor layer, a second gate insulating layer, a second gate electrode, a second interlayer insulating layer, a passivation layer, a second source electrode, and a second drain electrode; the second source electrode is on a side of the metal oxide semiconductor layer close to the base substrate; and the second drain electrode is on a side of the metal oxide semiconductor layer away from the base substrate.

15 Claims, 2 Drawing Sheets

(58) Field of Classification Search
      CPC ........... H10D 30/6723; H10D 30/6724; H10D
             30/811; H10D 30/6731; H10D 30/6755;
                   H10D 86/40; H10D 30/67
      See application file for complete search history.

(56) References Cited

U.S. PATENT DOCUMENTS

| | | | |
|---|---|---|---|
| 11,398,508 B2 * | 7/2022 | Kuwahara | H10D 86/481 |
| 2017/0294497 A1 * | 10/2017 | Lius | H10D 86/40 |
| 2021/0202540 A1 * | 7/2021 | Kuwahara | H10D 86/481 |
| 2021/0225975 A1 * | 7/2021 | Niu | G09G 3/3225 |

FOREIGN PATENT DOCUMENTS

| | | | |
|---|---|---|---|
| CN | 110416232 A | 11/2019 |
| CN | 112928125 A | 6/2021 |
| CN | 113241351 A | 8/2021 |
| JP | 2011043639 A | 3/2011 |

\* cited by examiner

DISPLAY SUBSTRATE AND DISPLAY DEVICE

CROSS-REFERENCE TO RELATED APPLICATION

This is a National Phase Application filed under 35 U.S.C. 371 as a national stage of PCT/CN2022/082407, filed on Mar. 23, 2022, the contents of which are incorporated herein by reference in their entirety

TECHNICAL FIELD

The present disclosure belongs to the field of display technology, and particularly relates to a display substrate and a display device.

BACKGROUND

With the continuous development of display technology, users propose higher and higher requirements on resolution, power consumption and image quality of display products. In order to meet those requirements, the Low Temperature Polycrystalline Oxide (LTPO) technology is usually adopted to manufacture pixel driving circuits in display substrates of the display products. The LTPO technology uses both a Low Temperature Poly-silicon Thin Film Transistor (LTPS TFT) and a metal Oxide Thin Film Transistor (Oxide TFT) as functional transistors in a pixel driving circuit. The LTPS TFT has a high mobility, which can increase a charging speed of a pixel capacitor, and the metal Oxide TFT has a relatively low leakage current. Therefore, by combining the advantages of the two kinds of TFTs together, development of display products with high resolution, low power consumption and high image quality is facilitated.

However, current equipment capability, conventional display design and process routing cannot meet requirements of ultrahigh resolution display products. For example, in a display product with a resolution of above 1500 PPI, a distance between a source electrode and a drain electrode of a metal oxide TFT is so short that a short circuit therebetween is prone to occur, which affects a display effect. Under the condition that the equipment capability cannot be improved, optimization of the display design and the process routing becomes a focus of research.

SUMMARY

In order to solve at least one of the problems in the prior art, the present disclosure provides a display substrate and a display device.

In a first aspect, embodiments of the present disclosure provide a display substrate, including: a base substrate, and at least one low temperature poly-silicon thin film transistor and at least one metal oxide thin film transistor, which are on the base substrate;

the low temperature poly-silicon thin film transistor includes: a low temperature poly-silicon semiconductor layer, a first gate insulating layer, a first gate electrode, a first interlayer insulating layer, a first source electrode, and a first drain electrode;

the metal oxide thin film transistor includes: a metal oxide semiconductor layer, a second gate insulating layer, a second gate electrode, a second interlayer insulating layer, a passivation layer, a second source electrode, and a second drain electrode; and the metal oxide semiconductor layer and the low temperature poly-silicon semiconductor layer are disposed in different layers; the second source electrode is on a side of the metal oxide semiconductor layer close to the base substrate; and the second drain electrode is on a side of the metal oxide semiconductor layer away from the base substrate.

In an embodiment, the metal oxide thin film transistor further includes: a buffer layer between the second source electrode and the metal oxide semiconductor layer;

the second source electrode is connected to a source contact region of the metal oxide semiconductor layer through a first via hole penetrating through the buffer layer; and the second drain electrode is connected to a drain contact region of the metal oxide semiconductor layer through a second via hole penetrating through the second gate insulating layer, the second interlayer insulating layer, and the passivation layer.

In an embodiment, a width of the source contact region of the metal oxide semiconductor layer is 0.1 μm to 1.5 μm greater than a width of the drain contact region of the metal oxide semiconductor layer.

In an embodiment, the second source electrode and a source contact region of the metal oxide semiconductor layer are lapped over each other; and the second drain electrode is connected to a drain contact region of the metal oxide semiconductor layer through a second via hole penetrating through the second gate insulating layer, the second interlayer insulating layer, and the passivation layer.

In an embodiment, the metal oxide thin film transistor further includes: a light-shielding layer which is between the first gate insulating layer and the first interlayer insulating layer and covers at least a channel region of the metal oxide semiconductor layer; and the light-shielding layer is connected to the second source electrode through a third via hole penetrating through the first interlayer insulating layer.

In an embodiment, the metal oxide thin film transistor further includes: a light-shielding which is between the first gate insulating layer and the first interlayer insulating layer and covers at least a channel region of the metal oxide semiconductor layer; and the light-shielding layer is connected to the second gate electrode through a fourth via hole penetrating through the second gate insulating layer, the buffer layer, and the first interlayer insulating layer.

In an embodiment, the metal oxide thin film transistor further includes: a light-shielding layer which is between the first gate insulating layer and the first interlayer insulating layer and covers at least a channel region of the metal oxide semiconductor layer; and the light-shielding layer is connected to the second gate electrode through a fourth via hole penetrating through the second gate insulating layer and the first interlayer insulating layer.

In an embodiment, the metal oxide thin film transistor further includes: a light-shielding layer which is between the first gate insulating layer and the first interlayer insulating layer and covers at least a channel region of the metal oxide semiconductor layer; the display substrate further includes: a constant voltage power supply; and the light-shielding layer is electrically connected to the constant voltage power supply.

In an embodiment, the metal oxide thin film transistor further includes: a light-shielding layer which is between the first gate insulating layer and the first interlayer insulating layer and covers at least a channel region of the metal oxide semiconductor layer; the display substrate further includes: a plurality of scanning signal lines on the base substrate; and both the second gate electrode and the light-shielding layer are electrically connected to a same scanning signal line.

In an embodiment, the display substrate further includes: a first conductive layer on the base substrate; and the first conductive layer includes: the first gate electrode and the light-shielding layer.

In an embodiment, the display substrate further includes: a second conductive layer on the base substrate; and the second conductive layer includes: the first source electrode, the first drain electrode, and the second source electrode.

In an embodiment, the first source electrode and the first drain electrode are on a side of the first interlayer insulating layer away from the base substrate; and the first source electrode is connected to a source contact region of the low temperature poly-silicon semiconductor layer through a fifth via hole penetrating through the first gate insulating layer and the first interlayer insulating layer; and the first drain electrode is connected to a drain contact region of the low temperature poly-silicon semiconductor layer through a sixth via hole penetrating through the first gate insulating layer and the first interlayer insulating layer.

In an embodiment, a material of the metal oxide semiconductor layer includes at least one of indium gallium zinc oxide, indium gallium tin oxide, and indium tin zinc oxide.

In an embodiment, a material of the second drain electrode includes: a transparent metal oxide.

In an embodiment, the transparent metal oxide includes: indium tin oxide.

In a second aspect, the embodiments of the present disclosure provide a display device, including the display substrate described above.

In an embodiment, the display device is a virtual reality display device or an augmented reality display device.

In an embodiment, a resolution of the virtual reality display device or the augmented reality display device is greater than or equal to 1500 PPI.

DETAIL DESCRIPTION OF EMBODIMENTS

In order to enable those of ordinary skill in the art to better understand the technical solutions of the present disclosure, the present disclosure is further described in detail below with reference to the drawings and specific embodiments.

Unless otherwise defined, technical terms or scientific terms used herein should have general meanings that are understood by those of ordinary skills in the technical field to which the present disclosure belongs. The words "first", "second" and the like used herein do not denote any order, quantity or importance, but are just used to distinguish between different elements. Similarly, the words "one", "a", "the" and the like do not denote a limitation to quantity, and indicate the existence of "at least one" instead. The words "include", "comprise" and the like indicate that an element or object before the words covers the elements or objects listed after the words or the equivalents thereof, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

Figure 1:
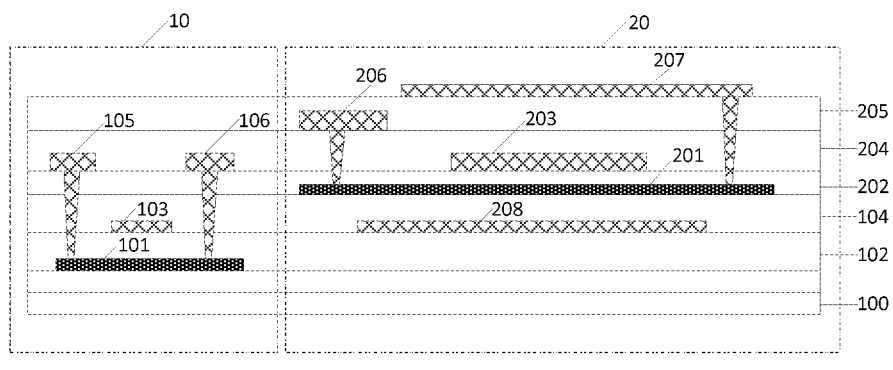
FIG. 1 is a schematic structural diagram of an exemplary display substrate.

FIG. 1 is a schematic structural diagram of an exemplary display substrate. As shown in FIG. 1, the display substrate includes: a base substrate 100, and at least one LTPS TFT 10 and at least one metal Oxide TFT 20 which are located on the base substrate 100. It should be understood that the number of the at least one LTPS TFT 10 and the number of the at least one metal Oxide TFT 20 may be set according to actual needs, and a case where the display substrate including one LTPS TFT 10 and one metal Oxide TFT 20 is taken as an example for illustration in this exemplary embodiment and the following description.

The LTPS TFT 10 includes: a low temperature poly-silicon layer 101, a first gate insulating layer 102, a first gate electrode 103, a first interlayer insulating layer 104, a first source electrode 105, and a first drain electrode 106, which are sequentially disposed on the base substrate 100. The metal Oxide TFT 20 includes: a metal oxide semiconductor layer 201, a second gate insulating layer 202, a second gate electrode 203, a second interlayer insulating layer 204, a passivation layer 205, a second source electrode 206, and a second drain electrode 207, which are sequentially disposed on the base substrate 100.

In order to avoid a mutual influence of the low temperature poly-silicon semiconductor layer 101 and the metal oxide semiconductor layer 201 in a preparation process, the low temperature poly-silicon semiconductor layer 101 and the metal oxide semiconductor layer 201 are generally disposed in different layers. In addition, in order to reduce process steps, the first source electrode 105, the first drain electrode 106, and the metal oxide semiconductor layer 201 may be disposed in a same layer.

The first source electrode 105 and the first drain electrode 106 are both located on the first interlayer insulating layer 104, the first source electrode 105 is connected to a source contact region of the low temperature poly-silicon semiconductor layer 101 through a via hole penetrating through the first gate insulating layer 102 and the first interlayer insulating layer 104, and the first drain electrode 106 is connected to a drain contact region of the low temperature poly-silicon semiconductor layer 101 through a via hole penetrating through the first gate insulating layer 102 and the first interlayer insulating layer 104. The second source electrode 206 is located on the second interlayer insulating layer 204, the second drain electrode 207 is located on the passivation layer 205, the second source electrode 206 is connected to a source contact region of the metal oxide semiconductor layer 201 through a via hole penetrating through the second gate insulating layer 202 and the second interlayer insulating layer 204, and the second drain electrode 207 is connected to a drain contact region of the metal oxide semiconductor layer 201 through a via hole penetrating through the second gate insulating layer 202, the second interlayer insulating layer 204, and the passivation layer 205.

The metal Oxide TFT 20 may further include: a light-shielding layer 208. The light-shielding layer 208 can cover at least a channel region of the metal oxide semiconductor layer 201, so as to prevent light from irradiating onto the channel region of the metal oxide semiconductor layer 201 from the side of the base substrate 100. The light-shielding layer 208 may be disposed between the first gate insulating layer 102 and the first interlayer insulating layer 104.

It could be understood that each thin film transistor in the display substrate shown in FIG. 1 is a top-gate thin film transistor; apparently, each thin film transistor in the display substrate shown in FIG. 1 may also be a bottom-gate thin film transistor, and an implementation principle of the bottom-gate thin film transistors is the same as that of the top-gate electrode thin film transistors described above, and thus will not be repeated here. A case where each thin film transistor is a top-gate thin film transistor is taken as an example for illustration in this exemplary embodiment and the following description.

With the increasing requirement of the users on the resolution of the display products, a distance between adjacent pixels becomes smaller and smaller, so that an area of a region occupied by each thin film transistor in a display substrate also becomes smaller and smaller, and as a result, a distance between a source electrode and a drain electrode in a same thin film transistor is too short and a distance between the source electrode/the drain electrode and a gate electrode is shorter. For example, in a display product with the resolution of 1500 PPI, a distance between the second source electrode 206 and the second drain electrode 207 is only 5.8 nm, and a distance between the second source electrode 206/the second drain electrode 207 and the second gate electrode 203 is only 0.95 nm. The above-mentioned distances are even shorter in an ultrahigh resolution display product with the resolution of 1800 PPI or 2000 PPI. Since both the second source electrode 206 and the second drain electrode 207 are connected to the metal oxide semiconductor layer 201 through the via holes, existing equipment cannot meet the requirements of the via holes with such small sizes, a short circuit between the second source electrode 206 and the second drain electrode 207 in the metal Oxide TFT 20 in the display substrate is prone to occur, which affects performance of the display substrate and makes user experience poorer.

On the other hand, the light-shielding layer 208 only plays a light shielding role, and is generally floating in the display substrate, that is, no electrical signal is input into the light-shielding layer 208. Thus, an induced voltage can be easily generated due to a mutual influence of the light-shielding layer 208 and other film layers into which electrical signals are input, and can act on the other film layers, which easily causes interference to the electrical signals input into the display substrate, thus making the input electrical signals unstable and affecting a display effect.

In order to solve at least one of the above technical problems, the embodiments of the present disclosure provide a display substrate and a display device, which will be described in detail below with reference to the drawings and specific implementations.

Figure 2:
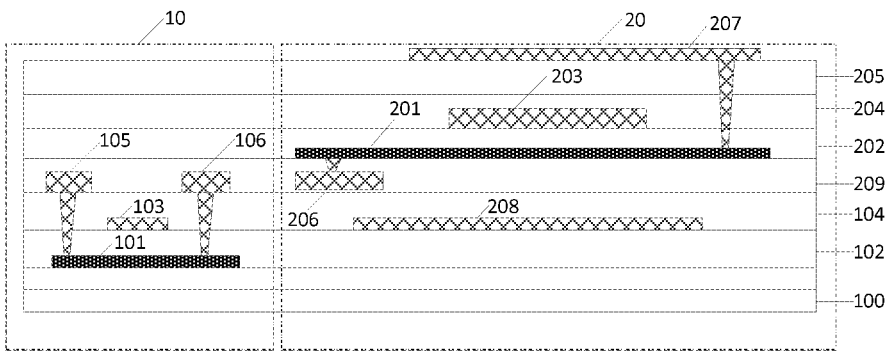
FIG. 2 is a schematic structural diagram of a display substrate according to at least one embodiment of the present disclosure.

FIG. 2 is a schematic structural diagram of a display substrate according to at least one embodiment of the present disclosure. As shown in FIG. 2, the display substrate includes: a base substrate 100, and at least one LTPS TFT 10 and at least one metal Oxide TFT 20 that are located on the base substrate. The LTPS TFT 10 includes: a low temperature poly-silicon semiconductor layer 101, a first gate insulating layer 102, a first gate electrode 103, a first interlayer insulating layer 104, a first source electrode 105, and a first drain electrode 106. The metal Oxide TFT 20 includes: a metal oxide semiconductor layer 201, a second gate insulating layer 202, a second gate electrode 203, a second interlayer insulating layer 204, a passivation layer 205, a second source electrode 206, and a second drain electrode 207. The metal oxide semiconductor layer 201 and the low temperature poly-silicon semiconductor layer 101 are disposed in different layers. The second source electrode 206 is located on a side of the metal oxide semiconductor layer 201 close to the base substrate 100; and the second drain electrode 207 is located on a side of the metal oxide semiconductor layer 201 away from the base substrate 100.

The base substrate 100 may be made of a rigid material such as glass, which may improve a capability of the base substrate 100 to bear other film layers thereon. Apparently, the base substrate 100 may also be made of a flexible material such as polyimide (PI), which may improve overall bending resistance and overall stretching resistance of the metal Oxide TFT, so that the base substrate 100 may be prevented from being broken due to a stress generated during a bending, stretching, or twisting process, thereby avoiding an open circuit such caused. In practical applications, the material of the base substrate 100 may be selected reasonably according to actual needs, so as to ensure good performance of the metal Oxide TFT. It should be understood that a buffer layer may be further disposed on the base substrate 100; and the buffer layer may be made of at least one of silicon nitride (SiN) and silicon dioxide ($SiO_2$), and may be formed into a single-layer structure made of a single material or a multi-layer structure made of a plurality of different materials, and a film layer in contact with the low temperature poly-silicon semiconductor layer 101 is a $SiO_2$ layer. The buffer layer may have a thickness ranging from 100 Å to 1500 Å, so as to prevent water, oxygen and other gases from intruding into other film layers on the buffer layer from the side of the base substrate 100 to damage the device.

The low temperature poly-silicon semiconductor layer 101 may be made of a low temperature poly-silicon material, for example, aSi may be adopted and subjected to laser irradiation, and is crystallized to form pSi; and a thickness of the low temperature poly-silicon semiconductor layer 101 may range from 300 Å to 700 Å. The low temperature poly-silicon semiconductor layer 101 formed from pSi has relatively high mobility, and can increase a charging speed of a pixel capacitor in the display substrate.

The first gate insulating layer 102 may be made of at least one of silicon nitride (SiN) and silicon dioxide ($SiO_2$), and may be formed into a single-layer structure made of a single material or a multi-layer structure made of a plurality of different materials, and a film layer in contact with the low temperature poly-silicon semiconductor layer 101 is a $SiO_2$ layer, so as to protect the low temperature poly-silicon semiconductor layer 101 and avoid a short circuit between the low temperature poly-silicon semiconductor layer 101 and the other film layers thereon.

The first gate electrode 103 may be made of at least one of gold (Au), silver (Ag), copper (Cu), nickel (Ni), platinum (Pt), palladium (Pd), aluminum (Al), molybdenum (Mo), and chromium (Cr), may be formed into a single-layer structure made of a single material, for example, the first gate electrode 103 has a single-layer structure made of aluminum (Al). Apparently, the first gate electrode 103 may also be formed into a multi-layer structure made of a plurality of different materials, such as a three-layer structure made of molybdenum (Mo), aluminum (Al), and molybdenum (Mo).

The first interlayer insulating layer 104 may be made of at least one of silicon nitride (SiN) and silicon dioxide ($SiO_2$), and may be formed into a single-layer structure made of a single material or a multi-layer structure made of a plurality of different materials. The first interlayer insulating layer 104 may have a thickness ranging from 1000 Å to 6000 Å. The first interlayer insulating layer 104 can avoid a short circuit between the first gate electrode 103 and the other film layers thereon.

The first source electrode 105 and the first drain electrode 106 may be disposed in a same layer, for example, both may be disposed on the first insulating layer 104, and may be electrically connected to a source contact region and a drain contact region of the low temperature poly-silicon semiconductor layer 101 through via holes penetrating through the first interlayer insulating layer 104 respectively. Each of the first source electrode 105 and the first drain electrode 106 may be made of at least one of aluminum (Al), molybdenum (Mo), and titanium (Ti), and may be formed into a single-layer structure made of a single material or a multi-layer structure made of a plurality of different materials, such as a three-layer structure of titanium (Ti)/aluminum (Al)/titanium (Ti).

The metal oxide semiconductor layer 201 may be made of at least one of Indium Gallium Zinc Oxide (IGZO), Indium Gallium Tin Oxide (IGTO), and Indium Tin Zinc Oxide (ITZO), and may allow the thin film transistor device to have a relatively small leakage current.

The second gate insulating layer 202 may be disposed in a way similar to that of the first gate insulating layer 102, the second gate electrode 203 may be disposed in a way similar to that of the first gate electrode 103, the second interlayer insulating layer 204 may be disposed in a way similar to that of the first interlayer insulating layer 104, the second source electrode 206 may be disposed in a way similar to that of the first source electrode 105, and the second drain electrode 207 may be disposed in a way similar to that of the first drain electrode 106, which will not be repeatedly described in detail here.

The passivation layer 205 may be made of at least one of silicon nitride (SiN) and silicon dioxide ($SiO_2$), and may be formed into a single-layer structure made of a single material or a multi-layer structure made of a plurality of different materials. A thickness of the passivation layer 205 may range from 2000 Å to 6000 Å.

In the display substrate provided by the embodiments of the present disclosure, the second source electrode 206 and the second drain electrode 207 in the metal Oxide TFT 20 are respectively located on two sides of the metal oxide semiconductor layer 201, the connection between the second source electrode 206 and the metal oxide semiconductor layer 201 and the connection between the second drain electrode 207 and the metal oxide semiconductor layer 201 may be formed in independent preparation steps, and are not affected by each other, which allows for shortening of a distance between the second source electrode 206 and the second drain electrode 207 according to actual needs. Thus, an area occupied by each thin film transistor in the display substrate can be reduced to meet the requirements of the ultrahigh resolution display products, thereby improving the display effect of the display substrate and user experience. On the other hand, since the second source electrode 206 and the second drain electrode 207 are not affected by each other, the short circuit between the second source electrode 206 and the second drain electrode 207 caused by the too short distance therebetween can be avoided, so that stability of each thin film transistor in the display substrate can be improved, thereby improving performance of the display substrate and the display effect of the display substrate.

In some embodiments, as shown in FIG. 2, the metal Oxide TFT 20 in the display substrate further includes: a buffer layer 209 between the second source electrode 206 and the metal oxide semiconductor layer 201. The second source electrode 206 is connected to a source contact region of the metal oxide semiconductor layer 201 through a first via hole penetrating through the buffer layer 209. The second drain electrode 207 is connected to a drain contact region of the metal oxide semiconductor layer 201 through a second via hole penetrating through the second gate insulating layer 202, the second interlayer insulating layer 204 and the passivation layer 205.

The buffer layer 209 may be made of at least one of silicon nitride (SiN) and silicon dioxide ($SiO_2$), and may be formed into a single-layer structure made of a single material or a multi-layer structure made of a plurality of different materials, and a film layer in contact with the metal oxide semiconductor layer 201 is a $SiO_2$ layer. A thickness of the buffer layer 209 may range from 1000 Å to 5000 Å.

In a preparation process, the buffer layer 209 may be formed on the second source electrode 206 first, the via hole penetrating through the buffer layer 209 is formed by an etching process to expose the second source electrode 206, the metal oxide semiconductor layer 201 is formed on the buffer layer through deposition, the second source electrode 206 is caused to be electrically connected to the source contact region of the metal oxide semiconductor layer 201 through the first via hole penetrating through the buffer layer 209, and then the second gate insulating layer 202, the second gate electrode 203, the second interlayer insulating layer 204, the passivation layer 205, and the second drain electrode 207 are sequentially formed, the second drain electrode 207 is caused to be connected to the drain contact region of the metal oxide semiconductor layer 201 through the second via hole penetrating through the second gate insulating layer 202, the second interlayer insulating layer 204, and the passivation layer 205. It can be seen that the first via hole corresponding to the second source electrode 206 and the second via hole corresponding to the second drain electrode 207 are respectively located on the two sides of the metal oxide semiconductor layer 201, and may be formed in independent preparation steps, and are not affected by each other. Thus, the distance between the second source electrode 206 and the second drain electrode 207 can be shortened according to actual needs, so that the area occupied by each thin film transistor in the display substrate can be reduced to meet the requirements of the ultrahigh resolution display products, thereby improving the display effect of the display substrate and the user experience. On the other hand, since the first via hole and the second via hole are not affected by each other, a short circuit between the second source electrode 206 and the second drain electrode 207 caused by a too short distance between the first via hole and the second via hole can be avoided, so that the stability of each thin film transistor in the display substrate can be improved, thereby improving the performance and the display effect of the display substrate.

In some embodiments, a width of the source contact region of the metal oxide semiconductor layer 201 is 0.1 µm to 1.5 µm greater than a width of the drain contact region of the metal oxide semiconductor layer 201.

In practical applications, the width of the source contact region of the metal oxide semiconductor layer 201 is greater, and a size of the source contact region of the metal oxide semiconductor layer 201 is obviously larger than that of the first via hole, so that the first via hole corresponding to the source contact region in the buffer layer 209 may be filled more fully with the material of the metal oxide semiconductor layer 201, and the source contact region above the first via hole may be formed into a relatively flat plane, so as to prevent other inorganic film layers on the source contact region from being affected by the first via hole, thereby improving the stability of the thin film transistor, and further improving the display effect of the display substrate.

Figure 3:
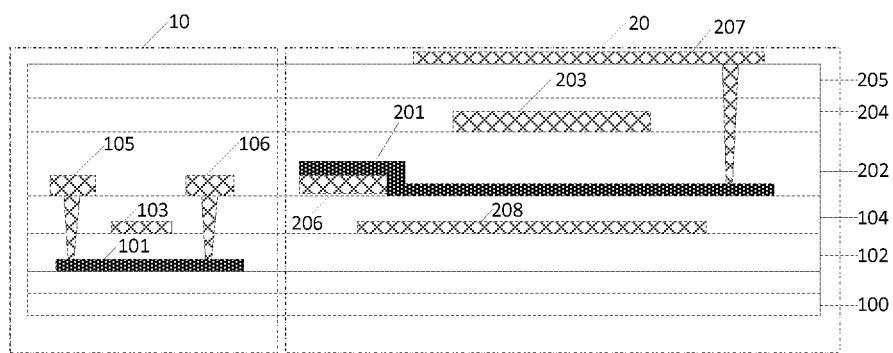
FIG. 3 is a schematic structural diagram of a display substrate according to at least one embodiment of the present disclosure.

FIG. 3 is a schematic structural diagram of another display substrate according to at least one embodiment of the present disclosure. As shown in FIG. 3, the second source electrode 206 and the source contact region of the metal oxide semiconductor layer 201 are lapped over each other; the second drain electrode 207 is connected to a drain contact region of the metal oxide semiconductor layer 201 through a second via hole penetrating through the second gate insulating layer 202, the second interlayer insulating layer 204, and the passivation layer 205.

The display substrate shown in FIG. 3 differs from the display substrate shown in FIG. 2 in that the film layer such as the buffer layer 209 is not disposed between the second source electrode 206 and the metal oxide semiconductor layer 201 and the second source electrode 206 and the source contact region of the metal oxide semiconductor layer 201 are directly lapped over each other in the display substrate shown in FIG. 3, which obviates the need to etch the buffer layer 209 to form the first via hole, so that the number of the process steps can be reduced, process difficulty can be weakened, and a manufacturing cost can be saved. Moreover, since the second source electrode 206 and the source contact region of the metal oxide semiconductor layer 201 are directly lapped over each other, a contact area between the second source electrode 206 and the source contact region can be increased, so that contact resistance between the second source electrode 206 and the source contact region can be reduced, and thus stability of the connection between the second source electrode 206 and the source contact region can be improved, thereby improving stability of the display substrate and further improving the display effect of the display substrate.

Figure 4:
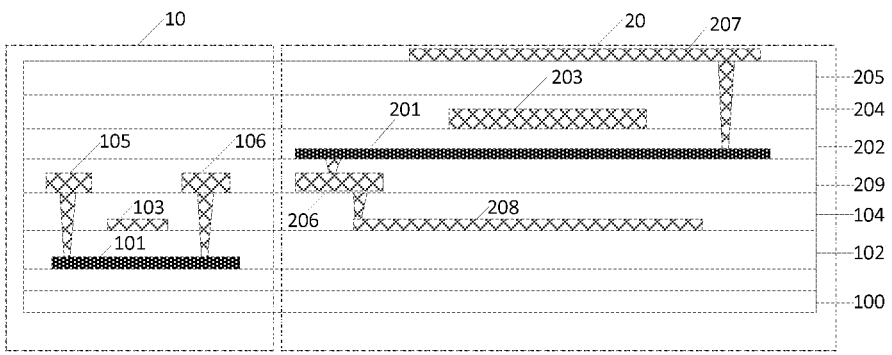
FIG. 4 is a schematic structural diagram of a display substrate according to at least one embodiment of the present disclosure.
Figure 5:
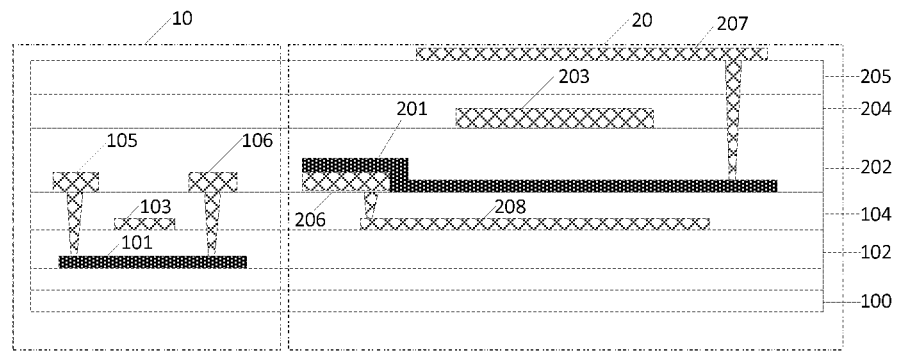
FIG. 5 is a schematic structural diagram of a display substrate according to at least one embodiment of the present disclosure.

FIG. 4 is a schematic structural diagram of another display substrate according to at least one embodiment of the present disclosure, and FIG. 5 is a schematic structural diagram of another display substrate according to at least one embodiment of the present disclosure. As shown in FIG. 4 and FIG. 5, the metal Oxide TFT further includes: a light-shielding layer 208 which is located between the first gate insulating layer 102 and the first interlayer insulating layer 104 and covers at least a channel region of the metal oxide semiconductor layer 201; and the light-shielding layer 208 is connected to the second source electrode 206 through a third via hole penetrating through the first interlayer insulating layer 104.

The light-shielding layer 208 may be made of at least one of gold (Au), silver (Ag), copper (Cu), nickel (Ni), platinum (Pt), palladium (Pd), aluminum (Al), molybdenum (Mo), and chromium (Cr), and may be formed into a single-layer structure made of a single material, for example, the light-shielding layer 208 is a single-layer structure made of aluminum (Al). Apparently, the light-shielding layer 208 may also be formed into a multi-layer structure made of a plurality of different materials, such as a three-layer structure made of molybdenum (Mo), aluminum (Al), and molybdenum (Mo).

The light-shielding layer 208 is located at a position corresponding to the channel region of the metal oxide semiconductor layer 201, and can play a role of shielding light to prevent incident light from the side of the base substrate 100 from irradiating onto the channel region of the metal oxide semiconductor layer 201 to affect the stability of the thin film transistor. In the embodiments of the present disclosure, the light-shielding layer 208 may be connected to the second source electrode 206 through the third via hole penetrating through the first interlayer insulating layer 104, and an electrical signal of the second source electrode 206 may be transmitted to the light-shielding layer 208, so that the light-shielding layer 208 is not floating, which can prevent an induced voltage from being generated between the light-shielding layer 208 and other film layers into which the electrical signals are input to avoid mutual interference therebetween, thereby improving stability of the input electrical signals and further improving the display effect of the display substrate.

Figure 6:
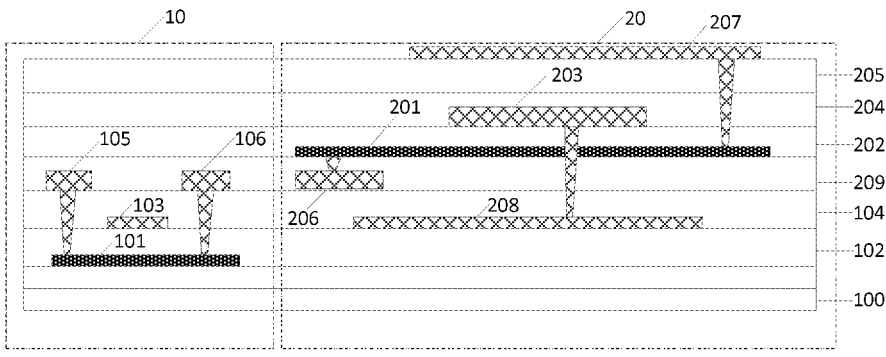
FIG. 6 is a schematic structural diagram of a display substrate according to at least one embodiment of the present disclosure.

FIG. 6 is a schematic structural diagram of another display substrate according to at least one embodiment of the present disclosure. As shown in FIG. 6, the metal Oxide TFT further includes: a light-shielding layer 208 which is located between the first gate insulating layer 102 and the first interlayer insulating layer 104 and covers at least a channel region of the metal oxide semiconductor layer 201; and the light-shielding layer 208 is connected to the second gate electrode 203 through a fourth via hole penetrating through the second gate insulating layer 202, the buffer layer 209, and the first interlayer insulating layer 104.

Figure 7:
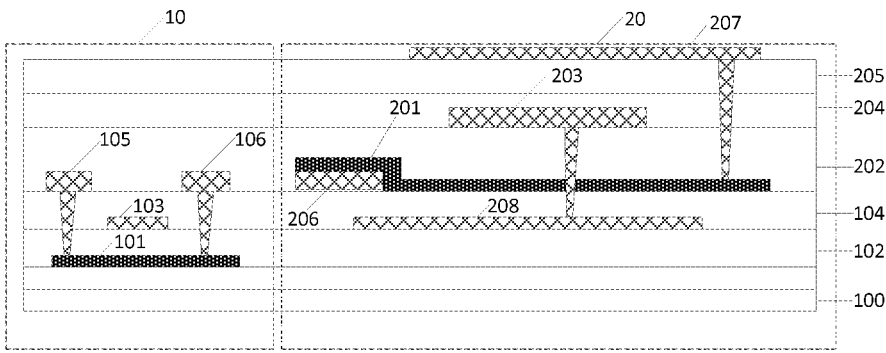
FIG. 7 is a schematic structural diagram of a display substrate according to at least one embodiment of the present disclosure.

FIG. 7 is a schematic structural diagram of another display substrate according to at least one embodiment of the present disclosure. As shown in FIG. 7, the metal Oxide TFT further includes: a light-shielding layer 208 which is located between the first gate insulating layer 102 and the first interlayer insulating layer 104 and covers at least a channel region of the metal oxide semiconductor layer 201; and the light-shielding layer 208 is connected to the second gate electrode 203 through a fourth via hole penetrating through the second gate insulating layer 202 and the first interlayer insulating layer 104.

A difference between the display substrates shown in FIG. 6 and FIG. 7 lies in that the display substrate shown in FIG. 6 is provided with the buffer layer 209 between the second source electrode 206 and the metal oxide semiconductor layer 201, while the display substrate shown in FIG. 7 is not provided with the buffer layer 209 between the second source electrode 206 and the metal oxide semiconductor layer 201. In the display substrates shown in FIG. 6 and FIG. 7, the light-shielding layer 208 may be connected to the second gate electrode 203 through the fourth via hole, and an electrical signal of the second gate electrode 203 may be transmitted to the light-shielding layer 208, so that the light-shielding layer 208 is not floating, which can prevent an induced voltage from being generated between the light-shielding layer 208 and other film layers into which the electrical signals are input to avoid mutual interference therebetween, thereby improving the stability of the input electrical signals and further improving the display effect of the display substrate.

In some embodiments, the metal Oxide TFT 20 further includes: a light-shielding layer 208 which is located between the first gate insulating layer 102 and the first interlayer insulating layer 104 and covers at least a channel region of the metal oxide semiconductor layer 201; and the display substrate further includes: a constant voltage power supply (not shown) electrically connected to the light-shielding layer 208.

In the embodiments of the present disclosure, the light-shielding layer 208 may be connected to an external constant voltage power supply, and an electrical signal provided by the constant voltage power supply may be transmitted to the light-shielding layer 208, so that the light-shielding layer 208 is not floating, which can prevent the induced voltage from being generated between the light-shielding layer 208 and the other film layers into which the electrical signals are input to avoid the mutual interference therebetween, thereby improving the stability of the input electrical signals and further improving the display effect of the display substrate.

In some embodiments, the metal Oxide TFT 20 further includes: a light-shielding layer 208 which is located between the first gate insulating layer 102 and the first interlayer insulating layer 104 and covers at least a channel region of the metal oxide semiconductor layer 201; the display substrate further includes: a plurality of scanning signal lines (not shown) on the base substrate 100; and both the second gate electrode 203 and the light-shielding layer 208 are electrically connected to a same scanning signal line.

In the embodiments of the present disclosure, both the second gate electrode 203 and the light-shielding layer 208 may be electrically connected to the same scanning signal line, so that an electrical signal provided by the same scanning signal line may be simultaneously input into the second gate electrode 203 and the light-shielding layer 208, and at this time, the light-shielding layer 208 may serve as another gate electrode of the metal Oxide TFT 20. In this way, the metal Oxide TFT 20 may be formed into a dual-gate structure, which can improve stability of input of the electrical signal. On the other hand, the electrical signal provided by the scanning signal line may be transmitted to the light-shielding layer 208, so that the light-shielding layer 208 is not floating, which may prevent the induced voltage from being generated between the light-shielding layer 208 and the other film layers into which the electrical signals are input to avoid the mutual interference therebetween, thereby improving the stability of the input electrical signals and further improving the display effect of the display substrate.

In some embodiments, the display substrate further includes: a first conductive layer on the base substrate 100; and the first conductive layer includes: the first gate electrode 103 and the light-shielding layer 208.

The first gate electrode 103 and the light-shielding layer 208 may be disposed in a same layer, made of a same material, and formed by a same manufacturing process, so as to save the manufacturing cost. Meanwhile, a thickness of the display substrate will not be increased, which facilitates lightening and thinning of the display substrate.

In some embodiments, the display substrate further includes: a second conductive layer on the base substrate 100; and the second conductive layer includes: the first source electrode 105, the first drain electrode 106, and the second source electrode 206.

The first source electrode 105, the first drain electrode 106, and the second source electrode 206 may be disposed in a same layer, made of a same material, and formed by a same manufacturing process, so as to save the manufacturing cost. Meanwhile, the thickness of the display substrate will not be increased, which facilitates the lightening and thinning of the display substrate.

In some embodiments, the first source electrode 105 and the first drain electrode 106 are located on a side of the first interlayer insulating layer 104 away from the base substrate 100. The first source electrode 105 is connected to a source contact region of the low temperature poly-silicon semiconductor layer 101 through a fifth via hole penetrating through the first gate insulating layer 102 and the first interlayer insulating layer 104. The first drain electrode 106 is connected to a drain contact region of the low temperature poly-silicon semiconductor layer 101 through a sixth via jp;e penetrating through the first gate insulating layer 102 and the first interlayer insulating layer 104. In the embodiments of the present disclosure, the LTPS TFT 10 and the metal Oxide TFT 20 may form an LTPO display substrate, the LTPS TFT 10 can accelerate the charging speed of the pixel capacitor due to its higher mobility, and the metal Oxide TFT has the lower leakage current. The combination of the advantages of the two kinds of TFTs facilitates the development of the display products with high resolution, low power consumption and high image quality. In some embodiments, a material of the second drain electrode 207 includes: a transparent metal oxide.

The second drain electrode 207 may be made of the transparent metal oxide, which may specifically include: Indium Tin Oxide (ITO). The transparent ITO can increase light transmittance of the display substrate, thereby improving the display effect of the display substrate. A thickness of the transparent ITO may specifically range from 200 Å to 1000 Å.

An embodiment of the present disclosure further provides a display device, including the display substrate provided by any one of the above embodiments. The display device may be a virtual reality display device or an augmented reality display device, and have a resolution greater than or equal to 1500 PPI, so as to realize high-resolution display and meet a requirement of users on high-resolution display images. It should be noted that an implementation principle and beneficial effects of the display device provided by the embodiment of the present disclosure are the same as those of the display substrate provided by any one of the above embodiments, and thus will not be repeated here.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A display substrate, comprising: a base substrate, and at least one low temperature poly-silicon thin film transistor and at least one metal oxide thin film transistor on the base substrate;

the low temperature poly-silicon thin film transistor comprises: a low temperature poly-silicon semiconductor layer, a first gate insulating layer, a first gate electrode, a first interlayer insulating layer, a first source electrode, and a first drain electrode;

the metal oxide thin film transistor comprises: a metal oxide semiconductor layer, a second gate insulating layer, a second gate electrode, a second interlayer insulating layer, a passivation layer, a second source electrode, and a second drain electrode; and the metal oxide semiconductor layer and the low temperature poly-silicon semiconductor layer are in different layers; the second source electrode is on a side of the metal oxide semiconductor layer close to the base substrate; and the second drain electrode is on a side of the metal oxide semiconductor layer away from the base substrate, wherein the display substrate further comprises a second conductive layer on the base substrate; and the second conductive layer comprises: the first source electrode, the first drain electrode, and the second source electrode.

2. The display substrate of claim 1, wherein the first source electrode and the first drain electrode are on a side of the first interlayer insulating layer away from the base substrate; and the first source electrode is connected to a source contact region of the low temperature poly-silicon semiconductor layer through a fifth via hole penetrating through the first gate insulating layer and the first interlayer insulating layer; and the first drain electrode is connected to a drain contact region of the low temperature poly-silicon semiconductor layer through a sixth via hole penetrating through the first gate insulating layer and the first interlayer insulating layer.

3. The display substrate of claim 1, wherein a material of the metal oxide semiconductor layer comprises at least one of indium gallium zinc oxide, indium gallium tin oxide, and indium tin zinc oxide.

4. The display substrate of claim 1, wherein a material of the second drain electrode comprises: a transparent metal oxide.

5. The display substrate of claim 4, wherein the transparent metal oxide comprises: indium tin oxide.

6. A display device, comprising the display substrate of claim 1.

7. The display device of claim 6, wherein the display device is a virtual reality display device or an augmented reality display device, and a resolution of the virtual reality display device or the augmented reality display device is greater than or equal to 1500 PPI.

8. The display substrate of claim 1, wherein the second source electrode and a source contact region of the metal oxide semiconductor layer are lapped over each other; and the second drain electrode is connected to a drain contact region of the metal oxide semiconductor layer through a second via hole penetrating through the second gate insulating layer, the second interlayer insulating layer, and the passivation layer.

9. The display substrate of claim 8, wherein the metal oxide thin film transistor further comprises: a light-shielding layer between the first gate insulating layer and the first interlayer insulating layer and covering at least a channel region of the metal oxide semiconductor layer; and the light-shielding layer is connected to the second gate electrode through a fourth via hole penetrating through the second gate insulating layer and the first interlayer insulating layer.

10. The display substrate of claim 8, wherein the metal oxide thin film transistor further comprises: a light-shielding layer between the first gate insulating layer and the first interlayer insulating layer and covering at least a channel region of the metal oxide semiconductor layer; and the light-shielding layer is connected to the second source electrode through a third via hole penetrating through the first interlayer insulating layer.

11. The display substrate of claim 1, wherein the metal oxide thin film transistor further comprises: a buffer layer between the second source electrode and the metal oxide semiconductor layer;

the second source electrode is connected to a source contact region of the metal oxide semiconductor layer through a first via hole penetrating through the buffer layer; and the second drain electrode is connected to a drain contact region of the metal oxide semiconductor layer through a second via hole penetrating through the second gate insulating layer, the second interlayer insulating layer, and the passivation layer.

12. The display substrate of claim 11, wherein a width of the source contact region of the metal oxide semiconductor layer is 0.1 μm to 1.5 μm greater than a width of the drain contact region of the metal oxide semiconductor layer.

13. The display substrate of claim 11, wherein the metal oxide thin film transistor further comprises: a light-shielding between the first gate insulating layer and the first interlayer insulating layer and covering at least a channel region of the metal oxide semiconductor layer; and the light-shielding layer is connected to the second gate electrode through a fourth via hole penetrating through the second gate insulating layer, the buffer layer, and the first interlayer insulating layer.

14. The display substrate of claim 11, wherein the metal oxide thin film transistor further comprises: a light-shielding layer between the first gate insulating layer and the first interlayer insulating layer and covering at least a channel region of the metal oxide semiconductor layer; and the light-shielding layer is connected to the second source electrode through a third via hole penetrating through the first interlayer insulating layer.

15. The display substrate of claim 14, further comprising: a first conductive layer on the base substrate; and the first conductive layer comprises: the first gate electrode and the light-shielding layer.

* * * * *